(12) United States Patent
Chang et al.

(10) Patent No.: US 9,847,296 B2
(45) Date of Patent: Dec. 19, 2017

(54) BARRIER LAYER AND STRUCTURE METHOD

(71) Applicant: Taiwan Semiconductor Manufacturing Company, Ltd., Hsin-Chu (TW)

(72) Inventors: Chih-Chung Chang, Tainan (TW); Jung-Chih Tsao, Tainian (TW); Chun Che Lin, Tainan (TW); Yu-Ming Huang, Tainan (TW); Tain-Shang Chang, Tainan (TW); Jian-Shin Tsai, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/181,493

(22) Filed: Feb. 14, 2014

(65) Prior Publication Data
US 2015/0235954 A1    Aug. 20, 2015

(51) Int. Cl.
*H01L 21/44* (2006.01)
*H01L 23/532* (2006.01)
*H01L 21/768* (2006.01)

(52) U.S. Cl.
CPC .. *H01L 23/53238* (2013.01); *H01L 21/76846* (2013.01); *H01L 21/76862* (2013.01); *H01L 21/76856* (2013.01); *H01L 23/53223* (2013.01); *H01L 23/53266* (2013.01); *H01L 2924/0002* (2013.01)

(58) Field of Classification Search
CPC ......... H01L 21/76814; H01L 21/76879; H01L 23/5226; H01L 23/528

USPC ........ 257/774; 438/653, 618, 675, 627, 702, 438/674, 700, 658
See application file for complete search history.

(56) References Cited

U.S. PATENT DOCUMENTS

| | | | | |
|---|---|---|---|---|
| 6,271,136 B1* | 8/2001 | Shue | ...................... | C23C 16/34 257/E21.17 |
| 6,475,907 B1* | 11/2002 | Taguwa | ............ | H01L 21/76843 257/E21.591 |
| 6,522,013 B1* | 2/2003 | Chen et al. | ................... | 257/774 |
| 6,528,423 B1* | 3/2003 | Catabay | ............ | H01L 21/31155 257/E21.248 |
| 6,721,136 B2* | 4/2004 | Kurihara | .............. | G11B 5/5552 310/311 |
| 2002/0000579 A1* | 1/2002 | Aoyama | ........... | H01L 21/32136 257/211 |
| 2003/0194859 A1* | 10/2003 | Huang | .............. | H01L 21/76846 438/652 |
| 2006/0115963 A1* | 6/2006 | Furuya | .................. | H01L 21/318 438/478 |
| 2007/0155186 A1 | 7/2007 | Baks et al. | | |

(Continued)

FOREIGN PATENT DOCUMENTS

CN          1976020 A    6/2007

*Primary Examiner* — Whitney T Moore
*Assistant Examiner* — Herve Assouman
(74) *Attorney, Agent, or Firm* — Slater Matsil, LLP

(57) ABSTRACT

A method for forming a multilayer barrier comprises forming a conductive line over a substrate, depositing a dielectric layer over the conductive line, forming a plug opening in the dielectric layer, forming a multilayer barrier through a plurality of deposition processes and corresponding plasma treatment processes.

19 Claims, 8 Drawing Sheets

(56) References Cited

U.S. PATENT DOCUMENTS

| | | | | |
|---|---|---|---|---|
| 2007/0269976 A1* | 11/2007 | Futase | ............... | H01L 21/02063 |
| | | | | 438/637 |
| 2008/0230847 A1* | 9/2008 | Furusawa | ......... | H01L 21/76832 |
| | | | | 257/384 |
| 2010/0151676 A1* | 6/2010 | Ritchie | ................... | C23C 16/34 |
| | | | | 438/660 |

* cited by examiner

BARRIER LAYER AND STRUCTURE METHOD

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative packaging techniques of semiconductor dies.

As semiconductor technologies evolve, wafer-level chip scale package structures have emerged as an effective alternative to further reduce the physical size of semiconductor devices. In a wafer-level chip scale package structure, active devices such as transistors and the like are formed at the top surface of a substrate of the wafer-level chip scale package structure. A variety of metallization layers comprising interconnect structures are formed over the substrate. Interconnection structures of a semiconductor device may comprise a plurality of lateral interconnections such as metal lines and a plurality of vertical interconnections such as vias, plugs and/or the like. The metal lines of the metallization layers are separated by dielectric layers. Trenches and vias are formed in the dielectric layers to provide an electrical connection between metal lines. Various active circuits of a semiconductor device may be coupled to external circuits through a variety of conductive channels formed by the vertical and lateral interconnections.

The metal lines and vias may be formed of copper. In order to prevent copper from being diffused into the surrounding materials, the metal lines and vias are surrounded by a barrier layer. As the process nodes further shrink, the size of vias decreases accordingly. The reduced via size demands a thin barrier layer. However, it has been found that the thickness of the barrier layer deposited along the sidewalls and the bottom of a via may affect the electrical characteristics of the via, such as the contact resistance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF ILLUSTRATIVE EMBODIMENTS

Figure 1:
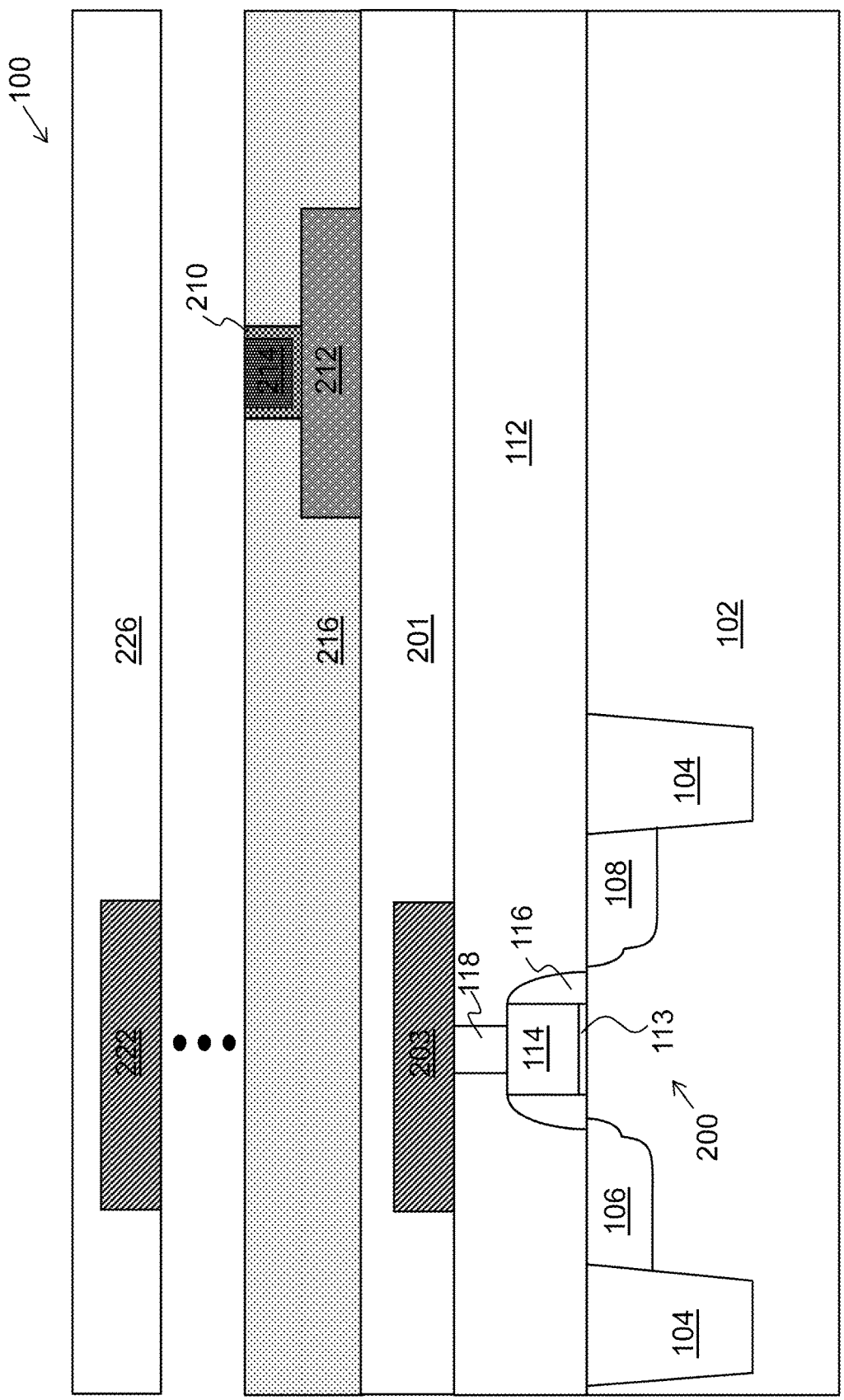
FIG. 1 illustrates a cross sectional view of a semiconductor device in accordance with various embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 illustrates a cross sectional view of a semiconductor device in accordance with various embodiments of the present disclosure. The semiconductor device 100 includes a transistor device 200, which is formed in a substrate 102 and a plurality of interconnect structures formed over the substrate 102.

The substrate 102 may be formed of silicon, although it may also be formed of other group III, group IV, and/or group V elements, such as silicon, germanium, gallium, arsenic, and combinations thereof. The substrate 102 may also be in the form of silicon-on-insulator (SOI). The SOI substrate may comprise a layer of a semiconductor material (e.g., silicon, germanium and/or the like) formed over an insulator layer (e.g., buried oxide or the like), which is formed in a silicon substrate. In addition, other substrates that may be used include multi-layered substrates, gradient substrates, hybrid orientation substrates and/or the like.

The substrate 102 may further comprise a variety of electrical circuits (not shown). The electrical circuits formed on the substrate 102 may be any type of circuitry suitable for a particular application. In accordance with an embodiment, the electrical circuits may include various n-type metal-oxide semiconductor (NMOS) and/or p-type metal-oxide semiconductor (PMOS) devices such as transistors, capacitors, resistors, diodes, photo-diodes, fuses and/or the like. The electrical circuits may be interconnected to perform one or more functions. The functions may include memory structures, processing structures, sensors, amplifiers, power distribution, input/output circuitry and/or the like. One of ordinary skill in the art will appreciate that the above examples are provided for illustrative purposes only and are not intended to limit the various embodiments to any particular applications.

The substrate 102 may comprise a variety of electrical circuits such as metal oxide semiconductor (MOS) transistors (e.g., transistor device 200) and the associated contact plugs (e.g., contact plug 118). For simplicity, only a single MOS transistor and a single contact plug are presented to illustrate the innovative aspects of various embodiments.

The transistor device 200 includes a first drain/source region 106 and a second drain/source region 108. The first drain/source region 106 and the second drain/source region 108 are formed on opposite sides of a gate structure of the transistor device 200. The gate structure is formed in a dielectric layer 112 and over the substrate 102. The gate structure may comprise a gate dielectric layer 113, a gate electrode 114 and spacers 116.

The gate dielectric layer 113 may be a dielectric material such as silicon oxide, silicon oxynitride, silicon nitride, an oxide, a nitrogen-containing oxide, a combination thereof and/or the like. The gate dielectric layer 113 may have a relative permittivity value greater than about 4. Other examples of such materials include aluminum oxide, lanthanum oxide, hafnium oxide, zirconium oxide, hafnium oxynitride, any combinations thereof and/or the like. In an embodiment in which the gate dielectric layer 113 comprises an oxide layer, the gate dielectric layer 113 may be formed by suitable deposition processes such as a plasma enhanced chemical vapor deposition (PECVD) process using tetra-ethoxysilane (TEOS) and oxygen as a precursor. In accordance with an embodiment, the gate dielectric layer 113 may be of a thickness in a range from about 8 Angstroms to about 200 Angstroms.

The gate electrode 114 may comprise a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, combinations thereof and/or the like. In an embodiment in which the gate electrode 114 is formed of poly-silicon, the gate electrode 114 may be formed by depositing doped or undoped poly-silicon by low-pressure chemical vapor deposition (LPCVD) to a thickness in the range of about 400 Angstroms to about 2,400 Angstroms.

The spacers 116 may be formed by blanket depositing one or more spacer layers (not shown) over the gate electrode 114 and the substrate 102. The spacers 116 may comprise suitable dielectric materials such as SiN, oxynitride, SiC, SiON, oxide and/or the like. The spacers 116 may be formed by commonly used techniques such as chemical vapor deposition (CVD), PECVD, sputter and/or the like.

The first and second drain/source regions 106 and 108 may be formed in the substrate 102 on opposing sides of the gate dielectric layer 113. In an embodiment in which the substrate 102 is an n-type substrate, the first and second drain/source regions 106 and 108 may be formed by implanting appropriate p-type dopants such as boron, gallium, indium and/or the like. Alternatively, in an embodiment in which the substrate 102 is a p-type substrate, the first and second drain/source regions 106 and 108 may be formed by implanting appropriate n-type dopants such as phosphorous, arsenic and/or the like.

As shown in FIG. 1, there may be two isolation regions formed on opposite sides of the transistor device 200. The isolation regions 104 may be shallow trench isolation (STI) regions. The STI regions may be formed by etching the substrate 102 to form a trench and filling the trench with a dielectric material as is known in the art. For example, the isolation regions 104 may be filled with a dielectric material such as an oxide material, a high-density plasma (HDP) oxide and/or the like. A planarization process such as a chemical mechanical planarization (CMP) process may be applied to the top surface so that the excess dielectric material may be removed as a result.

The dielectric layer 112 is formed on top of the substrate 102. The dielectric layer 112 may be formed, for example, of a low-K dielectric material, such as silicon oxide. The dielectric layer 112 may be formed by any suitable method known in the art, such as spinning, CVD and PECVD. It should also be noted that one skilled in the art will recognize while FIG. 1 illustrates a single dielectric layer, the dielectric layer 112 may comprise a plurality of dielectric layers.

As shown in FIG. 1, there may be a contact plug 118 formed in the dielectric layer 112. The contact plug 118 is formed over the gate electrode 114 to provide an electrical connection between the transistor device 200 and the interconnect structures formed over the dielectric layer 112.

The contact plug 118 may be formed by using photolithography techniques to deposit and pattern a photoresist material (not shown) on the dielectric layer 112. A portion of the photoresist is exposed according to the location and shape of the contact plug 118. An etching process, such as an anisotropic dry etch process, may be used to create an opening in the dielectric layer 112.

A conductive material is then filled in the opening. The conductive material may be deposited by using CVD, plasma vapor deposition (PVD), atomic layer deposition (ALD) and/or the like. The conductive material is deposited in the contact plug opening. Excess portions of the conductive material are removed from the top surface of the dielectric layer 112 by using a planarization process such as CMP. The conductive material may be copper, tungsten, aluminum, silver, titanium, titanium nitride, tantalum and any combinations thereof and/or the like.

A first dielectric layer 201 is formed over the dielectric layer 112. In some embodiments, the first dielectric layer 201 functions as an inter-metal dielectric layer. Throughout the description, the first dielectric layer 201 is alternatively referred to as the first inter-metal dielectric layer.

As shown in FIG. 1, there may be one metal line 203 formed in the first inter-metal dielectric layer 201. As shown in FIG. 1, two additional metallization layers 216 and 226 are formed over the first metallization layer 201. While FIG. 1 shows two metallization layers 216 and 226 formed over the first metallization layer 201, one skilled in the art will recognize that more inter-metal dielectric layers (not shown) and the associated metal lines and plugs (not shown) may be formed between the metallization layers (e.g., metallization layers 216 and 226) shown in FIG. 1. In particular, the layers between the metallization layers 216 and 226 shown in FIG. 1 may be formed by alternating layers of dielectric (e.g., extremely low-k dielectric material) and conductive materials (e.g., copper).

It should further be noted that the metallization layers shown in FIG. 1 may be formed by a single damascene process, although other suitable techniques such as deposition, dual damascene may alternatively be used. The single and dual damascene processes are well known in the art, and hence are not discussed herein.

The metal line 212 and the plug 214 are formed in the inter-metal dielectric layer 216. The second metal line 212 is embedded in the inter-metal dielectric layer 216, which is similar to the first inter-metal dielectric layer 201. The plug 204 is formed over and in direct contact with the metal line 212. The plug 214 is formed in a trench. As shown in FIG. 1, there may be a multilayer barrier 210 formed on the sidewalls and bottom of the trench.

The multilayer barrier 210 may comprise a plurality of barrier layers. Each barrier layer may be formed of Titanium Nitride (TiN). In accordance with an embodiment, the total number of the barrier layers is greater than or equal to 4. The total thickness of the multilayer barrier 210 is less than or equal to 250 Angstroms. The detailed structure and formation process of the multilayer barrier 210 will be described below with respect to FIGS. 2-7.

The metal line 212 and the plug 214 may be formed of metal materials such as copper, copper alloys, aluminum, silver, tungsten, gold, any combinations thereof and/or the like. The metal line 222 is similar to the metal line 212, and hence is not discussed to avoid unnecessary repetition.

Figure 2:
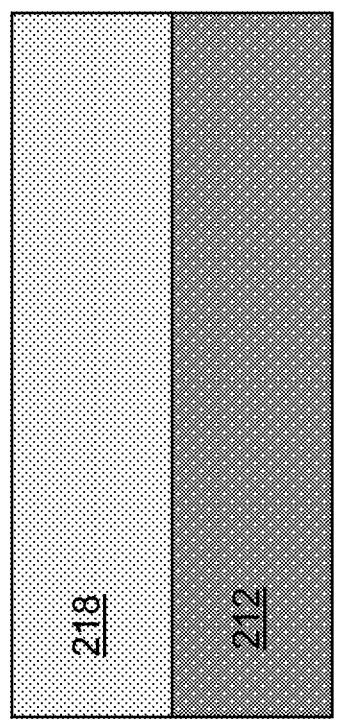
FIG. 2 illustrates a cross sectional view of a portion of the semiconductor device shown in FIG. 1 after a first dielectric layer is deposited over a metal line in accordance with various embodiments of the present disclosure.

FIGS. 2 to 7 illustrate intermediate steps of fabricating the multilayer barrier shown in FIG. 1 in accordance with various embodiments of the present disclosure. FIG. 2 illustrates a cross sectional view of a portion of the semiconductor device shown in FIG. 1 after a first dielectric layer is deposited over a metal line in accordance with various embodiments of the present disclosure. As described above with respect to FIG. 1, the metal line 212 may be formed of any suitable metal materials such as copper or copper alloys and the like. The metal line 212 may be formed through any suitable techniques (e.g., deposition, damascene and/or the like).

The first dielectric layer 218 may be formed of a low-K dielectric material such as fluorosilicate glass (FSG) and/or the like. The first dielectric layer 218 may function as an inter-metal dielectric layer. The first dielectric layer 218 may be formed by suitable deposition techniques such as PECVD techniques, high-density plasma chemical vapor deposition (HDPCVD) and/or the like.

Figure 3:
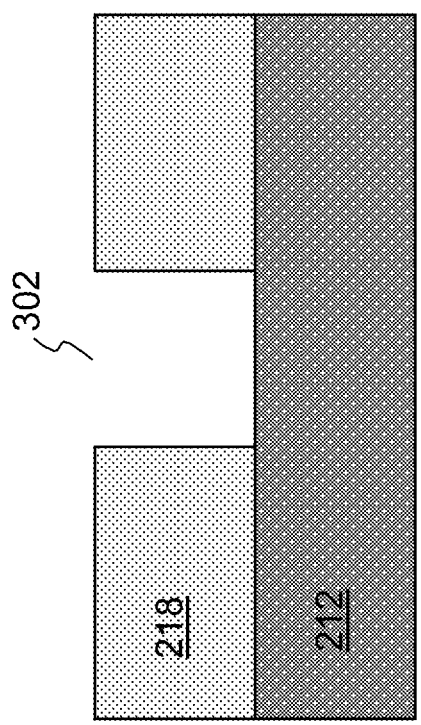
FIG. 3 illustrates a cross sectional view of the semiconductor device shown in FIG. 2 after an opening is formed in the first dielectric layer in accordance with various embodiments.

FIG. 3 illustrates a cross sectional view of the semiconductor device shown in FIG. 2 after an opening is formed in the first dielectric layer in accordance with various embodiments. According to the location of the plug formed upon the metal line 212, an opening 302 is formed in the first dielectric layer 218. The opening 302 may be formed by any suitable semiconductor patterning techniques such as an etching process, a laser ablation process and/or the like. For example, the opening 302 may be formed by using photolithography techniques to deposit and pattern a photoresist material on the first dielectric layer 218. A portion of the photoresist is exposed according to the location and shape of the plug 214 shown in FIG. 1. An etching process, such as an anisotropic dry etch process, may be used to create an opening in the first dielectric layer 218.

Figure 4:
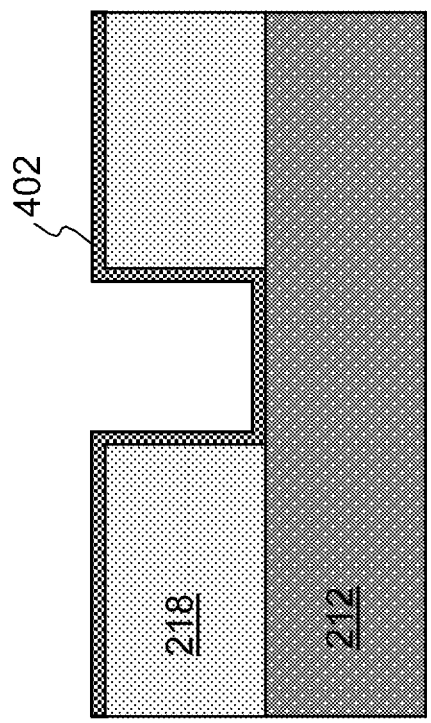
FIG. 4 illustrates a cross sectional view of the semiconductor device shown in FIG. 3 after a first barrier layer is deposited over the semiconductor device in accordance with various embodiments of the present disclosure.

FIG. 4 illustrates a cross sectional view of the semiconductor device shown in FIG. 3 after a first barrier layer is deposited over the semiconductor device in accordance with various embodiments of the present disclosure. Once the opening 302 has been formed within the first dielectric layer 218, the sidewalls and the bottom of the opening 302 may be deposited with the first barrier layer 402.

In some embodiments, the first barrier layer 402 may comprise TiN. Alternatively, the first barrier layer 402 may comprise other suitable dielectric and/or conductive materials, such as a nitrogen-containing layer, a carbon-containing layer, a hydrogen-containing layer, a silicon-containing layer, a metal or metal-containing layer doped with an impurity (e.g., boron), such as tantalum, tantalum nitride, titanium, titanium nitride, titanium zirconium, titanium zirconium nitride, tungsten, tungsten nitride, cobalt boron, an alloy, combinations thereof, or the like.

In some embodiments, the first barrier layer 402 may be formed by CVD. Alternatively, the first barrier layer 402 may be formed by other suitable deposition techniques such as PVD, ALD or other suitable methods. The first barrier layer 402 is of a thickness less than or equal to 60 Angstroms.

After the first barrier layer 402 is formed through the CVD process, there may some impurities such as carbon impurities in the first barrier layer 402. The carbon impurities may cause a higher resistance level in the first barrier layer 402. In order to improve the resistance of the first barrier 402, a first plasma treatment such as an $N_2H_2$ plasma treatment may be performed to reduce the concentration of the carbon impurities, thereby improving the resistance of the first barrier layer.

In some embodiments, after the first plasma treatment, an impurity concentration of a bottom portion of the first barrier layer is higher than an impurity concentration of an upper portion of the first barrier layer. In alternative embodiments, the impurity concentration of the first barrier layer is proportional to the depth of the first barrier layer. In other words, the bottom of the first barrier layer is of a highest impurity concentration and the top surface of the first barrier layer is of a lowest impurity concentration.

Figure 5:
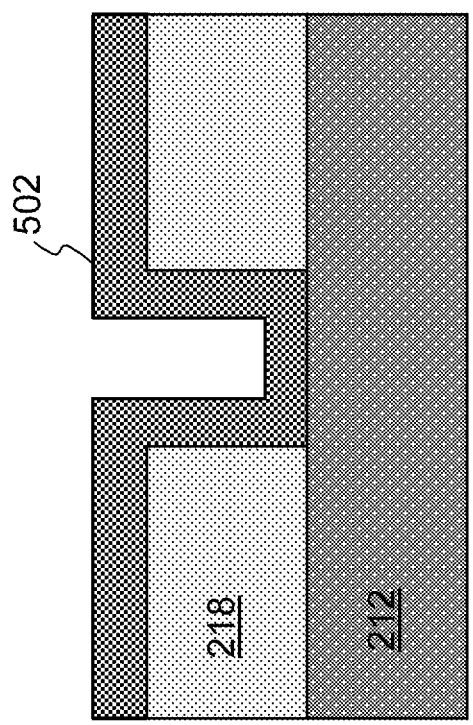
FIG. 5 illustrates a cross sectional view of the semiconductor device shown in FIG. 4 after a plurality of barrier layers are formed over the first barrier layer in accordance with various embodiments of the present disclosure.

FIG. 5 illustrates a cross sectional view of the semiconductor device shown in FIG. 4 after a plurality of barrier layers are formed over the first barrier layer in accordance with various embodiments of the present disclosure. A second barrier layer may be formed over the first barrier layer 402. The second barrier layer may be of the same material as the first barrier layer 402. In addition, the second barrier layer may be of a same thickness as the first barrier layer 402. Similarly, once the second barrier layer is formed, a second plasma treatment is performed to the second barrier so as to reduce the concentration of the carbon impurities, thereby improving the resistance of the second barrier layer. In some embodiments, the second plasma treatment may be similar to the first plasma treatment described above with respect to FIG. 4.

By repeating the CVD deposition and plasma treatment processes above, a plurality of barrier layers may be formed in the opening 302 as well as the top surface of the first dielectric layer 218. The plurality of barrier layers are collectively called a multilayer barrier 502.

One advantageous feature of having the multilayer barrier 502 is that the multilayer barrier 502 is thinner than a conventional barrier layer. For example, under a same resistance level, the conventional barrier is of a thickness of greater than or equal to 500 Angstroms. In contrast, to achieve the same performance characteristics, the multilayer barrier 502 is of a thickness of less than or equal to 250 Angstroms.

Figure 6:
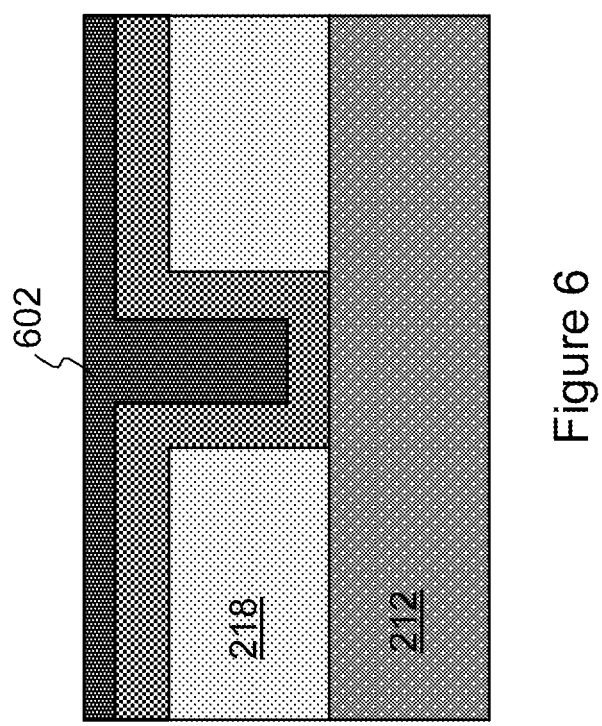
FIG. 6 illustrates a cross sectional view of the semiconductor device shown in FIG. 5 after a conductive material is filled in the opening in accordance with various embodiments of the present disclosure.

FIG. 6 illustrates a cross sectional view of the semiconductor device shown in FIG. 5 after a conductive material is filled in the opening in accordance with various embodiments of the present disclosure. In some embodiments, a seed layer (not shown) may be formed over the multilayer barrier. The seed layer may be may be formed of copper, nickel, gold, any combination thereof and/or the like. The seed layer may be formed by suitable deposition techniques such as PVD, CVD and/or the like. The seed layer may have a thickness in a range from about 50 Angstroms to about 1,000 Angstroms.

In addition, the seed layer may be alloyed with a material that improves the adhesive properties of the seed layer so that it can act as an adhesion layer. For example, the seed layer may be alloyed with a material such as manganese or aluminum, which will migrate to the interface between the seed layer and the barrier layer and will enhance the adhesion between these two layers. The alloying material may be introduced during formation of the seed layer. The alloying material may comprise no more than about 10% of the seed layer.

Once the seed layer is formed, a conductive material is then filled in the opening. The conductive material 602 may be Tungsten, but can be any suitable conductive materials, such as copper alloys, aluminum, copper, titanium, silver, any combinations thereof and/or the like. The conductive material 602 may be formed by suitable techniques such as an electro-less plating process, CVD, electroplating and/or the like.

Figure 7:
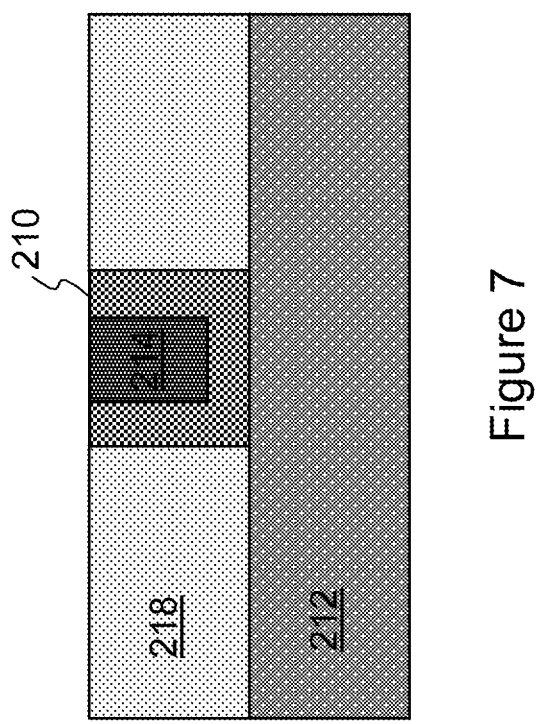
FIG. 7 illustrates a cross sectional view of the semiconductor device shown in FIG. 6 after a planarization process is performed to remove excess conductive materials in accordance with various embodiments of the present disclosure.

FIG. 7 illustrates a cross sectional view of the semiconductor device shown in FIG. 6 after a planarization process is performed to remove excess conductive materials in accordance with various embodiments of the present disclosure. The planarization process may be implemented by using suitable techniques such as grinding, polishing and/or chemical etching, a combination of etching and grinding techniques.

In accordance with various embodiments, the planarization process may be implemented by using a CMP process. In the CMP process, a combination of etching materials and abrading materials are put into contact with the top surface of the semiconductor device and a grinding pad (not shown) is used to grind away excess conductive material and the multilayer barrier until the first dielectric layer 218 is exposed as shown in FIG. 7.

Figure 8:
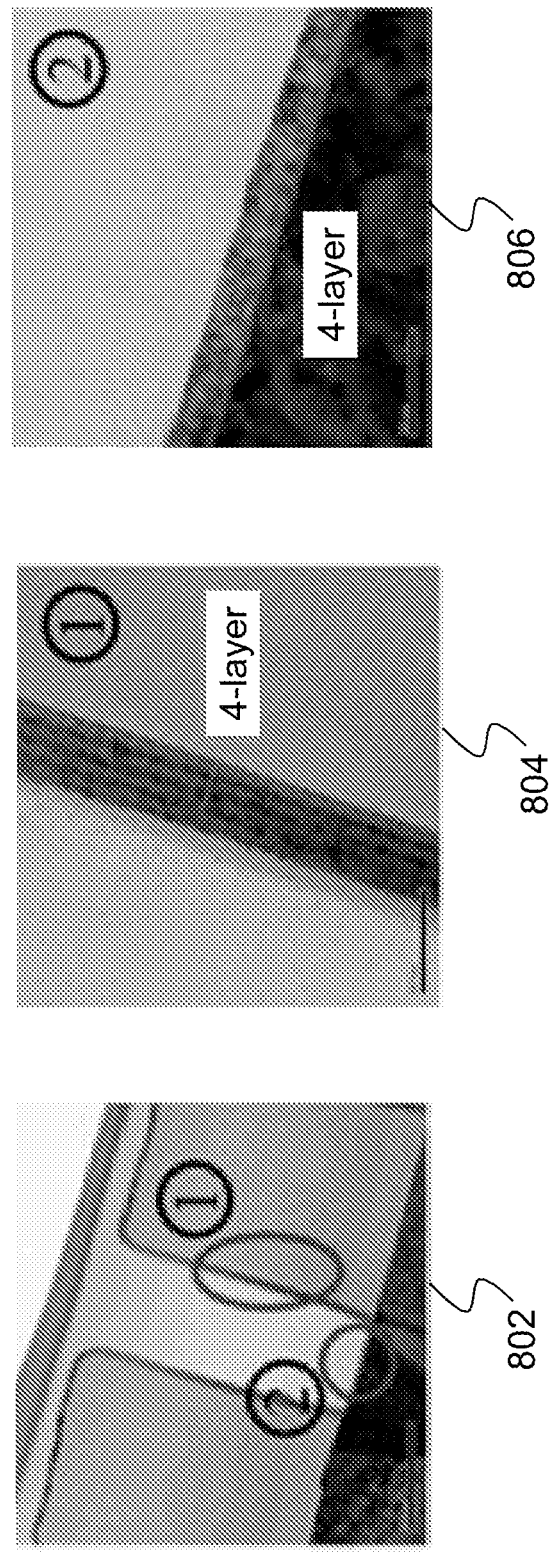
FIG. 8 illustrates results that may be obtained by embodiments such as those discussed herein.

FIG. 8 illustrates results that may be obtained by embodiments such as those discussed herein. Images 802, 804 and 806 are obtained by a Scanning Electron Microscope (SEM) of a multilayer barrier after being subjected to four plasma treatment processes as described above with respect to FIGS. 4-5. The image 804 shows the sidewall portion of the multilayer barrier has four layers. Likewise, the image 806 shows the bottom portion of the multilayer barrier has four layers.

In accordance with an embodiment, an apparatus comprises a conductive line formed over a substrate, a dielectric layer formed over the conductive line, an opening formed in the dielectric layer and a multilayer barrier formed along sidewalls as well as a bottom of the opening.

The multilayer barrier comprises a first barrier layer formed along the sidewalls as well as the bottom of the opening, wherein an impurity concentration of a bottom portion of the first barrier layer is higher than an impurity concentration of an upper portion of the first barrier layer, a second barrier layer formed over the first barrier layer, wherein an impurity concentration of a bottom portion of the second barrier layer is higher than an impurity concentration of an upper portion of the second barrier layer, a third barrier layer formed over the second barrier layer, wherein an impurity concentration of a bottom portion of the third barrier layer is higher than an impurity concentration of an upper portion of the third barrier layer and a fourth barrier layer formed over the third barrier layer, wherein an impurity concentration of a bottom portion of the fourth barrier layer is higher than an impurity concentration of an upper portion of the fourth barrier layer.

In accordance with an embodiment, a method comprises forming a conductive line over a substrate, depositing a dielectric layer over the conductive line, forming a plug opening in the dielectric layer, depositing a first barrier layer over a surface of the plug opening, applying a first plasma treatment process to the first barrier layer, depositing a second barrier layer over the first barrier layer, applying a second plasma treatment process to the second barrier layer, depositing a third barrier layer over the second barrier layer, applying a third plasma treatment process to the third barrier layer, depositing a fourth barrier layer over the third barrier layer and applying a fourth plasma treatment process to the fourth barrier layer.

In accordance with an embodiment, a method comprises forming a conductive line over a substrate, depositing a dielectric layer over the conductive line, forming a plug opening in the dielectric layer, forming a multilayer barrier through a plurality of deposition processes and corresponding plasma treatment processes, wherein a first barrier layer formed along sidewalls as well as a bottom of the plug opening, wherein an impurity concentration of a bottom portion of the first barrier layer is higher than an impurity concentration of an upper portion of the first barrier layer, a second barrier layer formed over the first barrier layer, wherein an impurity concentration of a bottom portion of the second barrier layer is higher than an impurity concentration of an upper portion of the second barrier layer, a third barrier layer formed over the second barrier layer, wherein an impurity concentration of a bottom portion of the third barrier layer is higher than an impurity concentration of an upper portion of the third barrier layer and a fourth barrier layer formed over the third barrier layer, wherein an impurity concentration of a bottom portion of the fourth barrier layer is higher than an impurity concentration of an upper portion of the fourth barrier layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   depositing a first dielectric layer over a substrate, wherein a gate structure is embedded in the first dielectric layer;
   depositing a second dielectric layer over and in contact with the first dielectric layer, wherein a first metal line is embedded in the second dielectric layer, and wherein the first metal line is electrically coupled to the gate structure;
   depositing a third dielectric layer over and in contact with the second dielectric layer;
   forming a conductive line in the third dielectric layer, wherein a bottom of the conductive line is in contact with a top surface of the second dielectric layer;
   forming a plug opening in the third dielectric layer, wherein the plug opening extends from a top surface of the third dielectric layer to a top surface of the conductive line;
   depositing a first barrier layer over a surface in the plug opening;
   applying a first plasma treatment process to the first barrier layer, wherein after the step of applying the first plasma treatment process, an impurity concentration of the first barrier layer is different at each level within the first barrier layer as a result of performing an $N_2H_2$ plasma treatment process on the first barrier layer;

depositing a second barrier layer over the first barrier layer;

applying a second plasma treatment process to the second barrier layer, wherein the second plasma treatment process removes impurities from at least an upper portion of the second barrier layer;

depositing a third barrier layer over the second barrier layer;

applying a third plasma treatment process to the third barrier layer;

depositing a fourth barrier layer over the third barrier layer;

applying a fourth plasma treatment process to the fourth barrier layer, wherein a multilayer barrier comprising the first barrier layer, the second barrier layer, the third barrier layer and the fourth barrier layer is formed in the plug opening.

2. The method of claim 1, wherein:
the first barrier layer is of a thickness less than or equal to 60 Angstroms;
the second barrier layer is of a thickness less than or equal to 60 Angstroms;
the third barrier layer is of a thickness less than or equal to 60 Angstroms; and
the fourth barrier layer is of a thickness less than or equal to 60 Angstroms.

3. The method of claim 1, further comprising:
depositing the first barrier layer using a first chemical vapor deposition process;
depositing the second barrier layer using a second chemical vapor deposition process;
depositing the third barrier layer using a third chemical vapor deposition process; and
depositing the fourth barrier layer using a fourth chemical vapor deposition process.

4. The method of claim 1, wherein:
the conductive line is formed of copper.

5. The method of claim 1, further comprising:
filling the plug opening with tungsten.

6. The method of claim 5, further comprising:
applying a planarization process to remove excess tungsten until the third dielectric layer is exposed.

7. A method comprising:
forming a first drain/source region and a second drain/source region in a substrate and between a first isolation region and a second isolation region;
forming a gate structure over the substrate and between the first drain/source region and a second drain/source region;
depositing a first dielectric layer over the substrate, wherein the gate structure is embedded in the first dielectric layer;
depositing a second dielectric layer over and in contact with the first dielectric layer, wherein a first metal line is embedded in the second dielectric layer, and wherein the first metal line is electrically coupled to the gate structure through a gate contact;
depositing a third dielectric layer over and in contact with the second dielectric layer;
forming a conductive line in the third dielectric layer, wherein the conductive line and the first metal line are on opposite sides of the second isolation region;

forming a plug opening in the third dielectric layer;
forming a multilayer barrier through a plurality of deposition processes and corresponding plasma treatment processes, wherein
a first barrier layer formed along sidewalls as well as a bottom of the plug opening, wherein an impurity concentration of a bottom portion of the first barrier layer is higher than an impurity concentration of an upper portion of the first barrier layer, and wherein an impurity concentration of the first barrier layer is different at each level within the first barrier layer as a result of performing a plasma treatment on the first barrier layer;
a second barrier layer formed over the first barrier layer, wherein an impurity concentration of a bottom portion of the second barrier layer is higher than an impurity concentration of an upper portion of the second barrier layer;
a third barrier layer formed over the second barrier layer, wherein an impurity concentration of a bottom portion of the third barrier layer is higher than an impurity concentration of an upper portion of the third barrier layer;
a fourth barrier layer formed over the third barrier layer, wherein an impurity concentration of a bottom portion of the fourth barrier layer is higher than an impurity concentration of an upper portion of the fourth barrier layer, wherein the multilayer barrier comprises the first barrier layer, the second barrier layer, the third barrier layer and the fourth barrier layer;
depositing a fourth dielectric layer over the third dielectric layer; and
forming a second metal line in the fourth dielectric layer, wherein outermost edges of the second metal line are vertically aligned with outermost edges of the first metal line, respectively.

8. The method of claim 7, further comprising:
filling the plug opening with a conductive material.

9. The method of claim 8, wherein:
the conductive material is tungsten.

10. The method of claim 8, further comprising:
applying a planarization process to remove the conductive material over a top surface of the third dielectric layer.

11. The method of claim 8, further comprising:
before the step of filling the plug opening with the conductive material, depositing a seed layer along sidewalls and the bottom of the plug opening.

12. The method of claim 7, wherein:
the plasma treatment processes are implemented by using an $N_2H_2$ plasma beam.

13. A method comprising:
forming a metal line and a conductive line over a substrate comprising a portion of a transistor, wherein a source and a drain of the transistor are formed in the substrate and between a first isolation region and a second isolation region, and wherein a gate of the transistor is over the substrate, and wherein the metal line is electrically connected to the gate, and wherein a bottom surface of the conductive line is higher than a top surface of the metal line;
depositing a dielectric layer over the conductive line;
patterning the dielectric layer to form a plug opening;
depositing a first barrier layer on a bottom and sidewalls of the plug opening;
applying a first plasma treatment process to the first barrier layer to reduce a carbon impurity concentration of the first barrier layer, wherein after the step of applying the first plasma treatment process, an impurity concentration of the first barrier layer is different at each level within the first barrier layer as a result of performing the first plasma treatment process to the first barrier layer;

filling the plug opening with a conductive material to form an interconnect structure, wherein a top surface of the interconnect structure is level with a top surface of the dielectric layer;

depositing a second barrier layer over the first barrier layer; and applying a second plasma treatment process to the second barrier layer to reduce a carbon impurity concentration of the second barrier layer, wherein after the step of applying the second plasma treatment process, an impurity concentration of the second barrier layer is different at each level within the second barrier layer as a result of performing the second plasma treatment process to the second barrier layer.

14. The method of claim 13, further comprising:
applying a dry etch process to the dielectric layer to form the plug opening.

15. The method of claim 13, wherein:
the first barrier layer is formed of titanium nitride (TiN); and
the conductive material is tungsten.

16. The method of claim 13, wherein:
after the step of applying the first plasma treatment process to the first barrier layer to reduce the carbon impurity concentration of the first barrier layer, an impurity concentration of a bottom portion of the first barrier layer is higher than an impurity concentration of an upper portion of the first barrier layer.

17. The method of claim 13, further comprising:
depositing a third barrier layer over the second barrier layer;
applying a third plasma treatment process to the third barrier layer;
depositing a fourth barrier layer over the third barrier layer; and
applying a fourth plasma treatment process to the fourth barrier layer.

18. The method of claim 17, wherein:
a multilayer barrier comprising the first barrier layer, the second barrier layer, the third barrier layer, and the fourth barrier layer has a thickness less than or equal to 250 Angstroms.

19. The method of claim 1, further comprising:
depositing a fourth dielectric layer over the third dielectric layer; and
forming a second metal line in the fourth dielectric layer, wherein outermost edges of the second metal line are vertically aligned with outermost edges of the first metal line, respectively.

* * * * *